United States Patent
Cho

(10) Patent No.: US 9,570,190 B2
(45) Date of Patent: Feb. 14, 2017

(54) SEMICONDUCTOR MEMORY DEVICE TO SELECTIVELY PERFORM A SINGLE SENSING OPERATION OR A MULTI-SENSING OPERATION

(71) Applicant: SK hynix Inc., Icheon-si, Gyeonggi-do (KR)

(72) Inventor: Ka Young Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/716,137

(22) Filed: May 19, 2015

(65) Prior Publication Data

US 2016/0180956 A1    Jun. 23, 2016

(30) Foreign Application Priority Data

Dec. 19, 2014    (KR) .......................... 10-2014-0184561

(51) Int. Cl.
    *G11C 16/00* (2006.01)
    *G11C 16/34* (2006.01)
    *G11C 16/10* (2006.01)
    *G11C 16/26* (2006.01)

(52) U.S. Cl.
    CPC .......... *G11C 16/3436* (2013.01); *G11C 16/10* (2013.01); *G11C 16/26* (2013.01); *G11C 16/34* (2013.01); *G11C 16/3459* (2013.01)

(58) Field of Classification Search
    None
    See application file for complete search history.

(56) References Cited

U.S. PATENT DOCUMENTS

| | | | | |
|---|---|---|---|---|
| 2008/0117688 A1* | 5/2008 | Park | ................... | G11C 16/3454 365/185.22 |
| 2010/0165744 A1 | 7/2010 | Ogawa et al. | | |
| 2011/0110154 A1* | 5/2011 | Kim | ................... | G11C 11/5628 365/185.03 |
| 2011/0158000 A1* | 6/2011 | Cho | ................... | G11C 16/3454 365/185.22 |
| 2011/0292724 A1* | 12/2011 | Kim | ................... | G11C 16/0483 365/185.03 |
| 2014/0063961 A1* | 3/2014 | Sakai | .................. | G11C 11/5628 365/185.17 |

FOREIGN PATENT DOCUMENTS

KR    1020140088383 A    7/2014

* cited by examiner

*Primary Examiner* — Kretelia Graham
(74) *Attorney, Agent, or Firm* — William Park & Associates Ltd.

(57) ABSTRACT

A semiconductor memory device and a method of operating the same are provided. The semiconductor memory device may include a memory cell array including a plurality of memory cells, and a peripheral circuit configured to perform a program pulse applying operation and a verification operation on the memory cell array. The semiconductor memory device may include a control logic configured to control the peripheral circuit to selectively perform a single sensing operation or a multi sensing operation during the verification operation.

18 Claims, 8 Drawing Sheets

PB1

SEMICONDUCTOR MEMORY DEVICE TO SELECTIVELY PERFORM A SINGLE SENSING OPERATION OR A MULTI-SENSING OPERATION

CROSS-REFERENCE TO RELATED APPLICATION

The present application claims priority to Korean patent application number 10-2014-0184561 filed on Dec. 19, 2014, in the Korean Intellectual Property Office, the entire disclosure of which is incorporated by reference herein.

BACKGROUND

1. Technical Field

Various embodiments generally relate to a semiconductor memory device and a method of operating the same. More particularly, the various embodiments may relate to a semiconductor memory device capable of improving an operation speed thereof and a method of operating the same.

2. Related Art

A semiconductor memory device is a memory device embodied using a semiconductor formed of silicon (Si), germanium (Ge), gallium arsenide (GaAs), indium phosphide (InP), and/or the like. The semiconductor memory device may be classified as either a volatile memory device or a nonvolatile memory device.

When a supply of an electric power is interrupted, data stored in the volatile memory is erased. The volatile memory device may include a static RAM (SRAM), a dynamic RAM (DRAM), a synchronous DRAM (SDRAM), and/or the like. Although the supply of an electric power may be interrupted, the nonvolatile memory device maintains data stored in the nonvolatile memory device. The nonvolatile memory device may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and/or the like. Flash memory may be classified as either a NOR type or a NAND type of memory.

BRIEF SUMMARY

In an embodiment, a semiconductor memory device may include a memory cell array including a plurality of memory cells, and a peripheral circuit configured to perform a program pulse applying operation and a verification operation on the memory cell array. The semiconductor memory device may include a control logic configured to control the peripheral circuit to selectively perform a single sensing operation or a multi sensing operation during the verification operation.

In an embodiment, a method of operating a semiconductor memory device may include applying a program pulse to memory cells selected among a plurality of memory cells. The method of operating the semiconductor memory device may include selecting a sensing method of a subsequent verification operation between a single sensing operation or a multi sensing operation based on the number of applied program pulses or the number of performed verification operations. The method of operating the semiconductor memory device may include performing a verification operation by continuously performing a first sensing operation and a second sensing operation when the multi sensing operation is selected from the selecting of the sensing method of the subsequent verification operation, and performing a second sensing operation when the single sensing operation is selected therefrom.

In an embodiment, a method of operating a semiconductor memory device may include applying a program pulse to memory cells selected from a plurality of memory cells. The method of operating the semiconductor memory device may include determining a verification operation to perform a multi sensing operation when a subsequent verification operation is a verification operation to distinguish an erase cell and a program cell. The method of operating the semiconductor memory device may include selecting a sensing method of the subsequent verification operation as a single sensing operation or a multi sensing operation based on the number of the applied program pulses or the number of the performed verification operations when the verification operation is determined as not a verification operation to distinguish the erase cell and the program cell during the determining of the verification operation. The method of operating the semiconductor memory device may include sequentially performing a first sensing operation and a second sensing operation when the multi sensing operation is selected from the determining of the verification operation or selecting the sensing method of the subsequent verification operation, and performing a verification operation by performing the second sensing operation when the single sensing operation is selected from the selecting of the sensing method of the subsequent verification operation.

DETAILED DESCRIPTION

Hereinafter, various example of embodiments will be described below with reference to the accompanying drawings. However, the embodiments may be embodied in different forms and should not be construed as limited to the embodiments set forth herein.

Throughout this specification, it will be understood that when a portion is "connected to" another portion, the portion may be "directly connected to" another portion, or the portion may be "indirectly connected to" another portion with an intervening element between the portions. Throughout this specification, it will be understood that when a portion "includes" another portion, without any contrary statement, the portion should not exclude another element, but may include another element.

Various embodiments may be directed toward a semiconductor memory device capable of decreasing a program verification time and a method of operating the same.

Figure 1:
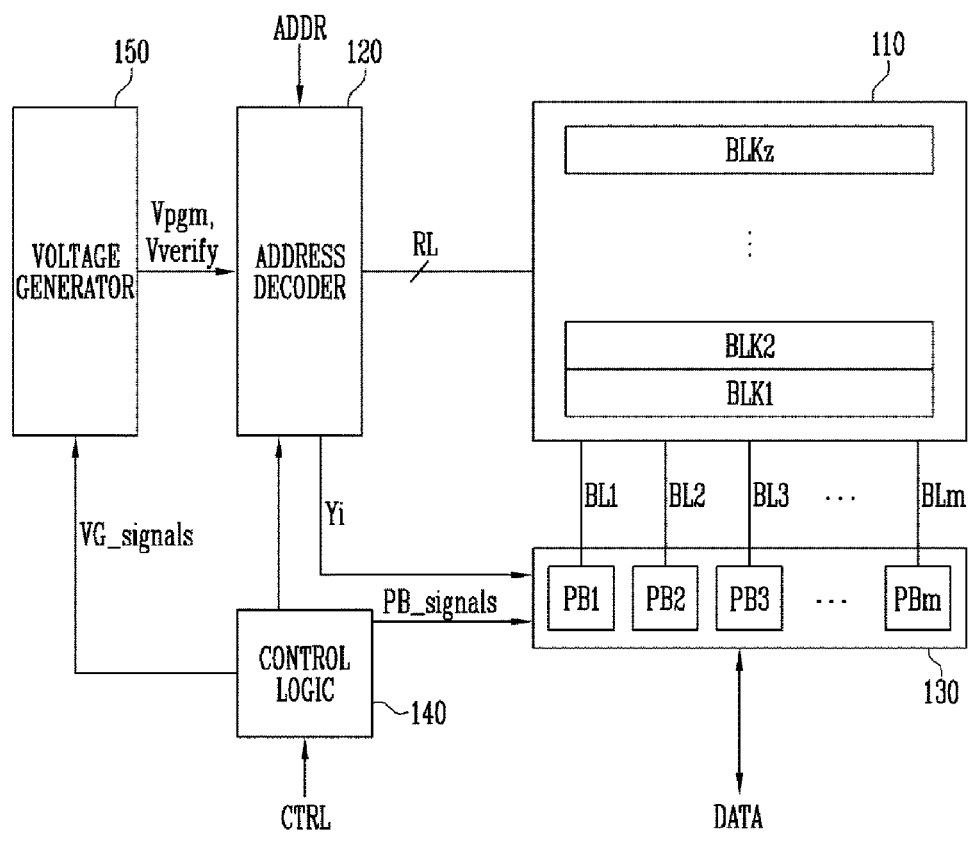
FIG. 1 is a block diagram illustrating a representation of an example of a semiconductor memory device according to an embodiment.

FIG. 1 is a block diagram illustrating a representation of an example of a semiconductor memory device according to an embodiment.

Referring to FIG. 1, the semiconductor memory device 100 may include a memory cell array 110, an address decoder 120, and a read/write circuit 130. The semiconductor memory device 100 may include a control logic 140, and a voltage generator 150.

The memory cell array 110 may include a plurality of memory blocks BLK1 to BLKz. The plurality of memory blocks BLK1 to BLKz are connected to the address decoder 120 through row lines RL. The plurality of memory blocks BLK1 to BLKz are connected to the read/write circuit 130 through bit lines BL (i.e., BL1 to BLm). Each of the plurality of memory blocks BLK1 to BLKz includes a plurality of memory cells. In an embodiment, the plurality of memory cells may be nonvolatile memory cells.

The address decoder 120, the read/write circuit 130, and the control logic 140 may operate as peripheral circuits configured to drive the memory cell array 110.

The address decoder 120 is connected to the memory cell array 110 through the row lines RL. The address decoder 120 may be configured to operate in response to a control of the control logic 140. The address decoder 120 receives addresses ADDR through an input/output buffer (not illustrated) disposed inside the semiconductor memory device 100.

The address decoder 120 is configured to decode a block address among the received addresses ADDR. The address decoder 120 selects at least one memory block based on the decoded block address. The address decoder 120 applies a program pulse Vpgm generated from the voltage generator 150 to a selected word line when a program voltage applying operation is performed in the program operation. The address decoder 120 applies the verification voltage Vverify to the selected word line when a verification operation is performed in the program operation.

The address decoder 120 is configured to decode a row address among the received addresses ADDR. The address decoder 120 is configured to operate row lines connected to the selected memory block based on the decoded row address.

The address decoder 120 is configured to decode a column address among the received addresses ADDR. The address decoder 120 may transmit the decoded column address Yi to the read/write circuit 130.

The program operation and the program verification operation of the semiconductor memory device 100 may be performed in page units. The addresses ADDR received during a request for the program operation may include a block address, a row address, and a column address. The address decoder 120 selects one memory block and one word line based on the block address and the row address. The column address is decoded by the address decoder 120, and may be provided to the read/write circuit 130.

The address decoder 120 may include a block decoder, a row decoder, a column decoder, an address buffer, and/or the like.

The read/write circuit 130 may include a plurality of page buffers PB1 to PBm. The plurality of page buffers PB1 to PBm are connected to the memory cell array 110 through the bit lines BL. In order to sense threshold voltages of memory cells during the program verification operation, the plurality of page buffers PB1 to PBm sense variations in current flows based on a state of a corresponding memory cell while sensing current is continuously supplied to bit lines connected to the memory cells, thereby latching the sensed data as sensing data.

The read/write circuit 130 may operate in response to the page buffer control signals PB_signals output from the control logic 140.

The read/write circuit 130 exchanges data DATA with the input/output buffer (not illustrated) of the semiconductor memory device 100. In the program operation, the read/write circuit 130 receives data DATA to be programmed and stores the received data DATA in the page buffers PB1 to PBm. In the program operation, the read/write circuit 130 transmits the stored data DATA to bit lines indicated by a decoded column address Yi among the bit lines BL. The transmitted data DATA is programmed in memory cells connected to the selected word line. In the program operation, the program pulse applying operation and the program verification operation may be alternately performed. In the program pulse applying operation, a program voltage is applied to the selected memory cell to increase a threshold voltage of the selected memory cell. In the program verification operation, a verification voltage is applied to the selected memory cell and threshold voltages of the memory cells are sensed to determine whether the voltages are higher than a target threshold voltage after completion of the program operation.

The read/write circuit 130 may selectively perform a single sensing operation or a multi sensing operation during the program verification operation. In a program verification operation during an initial program operation of a program operation, the number of erased cells is relatively large, and a threshold voltage of a cell may be sensed at a level higher than an actual threshold voltage by a source bouncing phenomenon. Thus, the multi sensing operation is performed to improve accuracy of the sensing operation. In other program operations except the initial program operation in the program operation, the number of erased cells is decreased. Thus, the single sensing operation is performed to reduce a program verification time. The initial program operation may include performing program pulse applying operations by a set number of times and program verification operations by a set number of times.

In an example of an embodiment, the read/write circuit 130 may include the page buffers (or page registers), a column select circuit, and/or the like.

The control logic 140 is connected to the address decoder 120, the read/write circuit 130, and the voltage generator 150. The control logic 140 receives a control signal CTRL through the input/output buffer (not illustrated) of the semiconductor memory device 100. The control logic 140 may be configured to control overall operations of the semiconductor memory device 100 in response to the control signal CTRL.

The voltage generator 150 may generate a program voltage Vpgm in response to voltage generator control signals VG_signals output from the control logic 140 during the program voltage applying operation in the program operation. The voltage generator 150 may generate a verification voltage Vverify during the verification operation. The verification voltage Vverify is classified into a pre-verification voltage and a target verification voltage, and the pre-verification voltage has a level lower than the target verification voltage.

Figure 2:
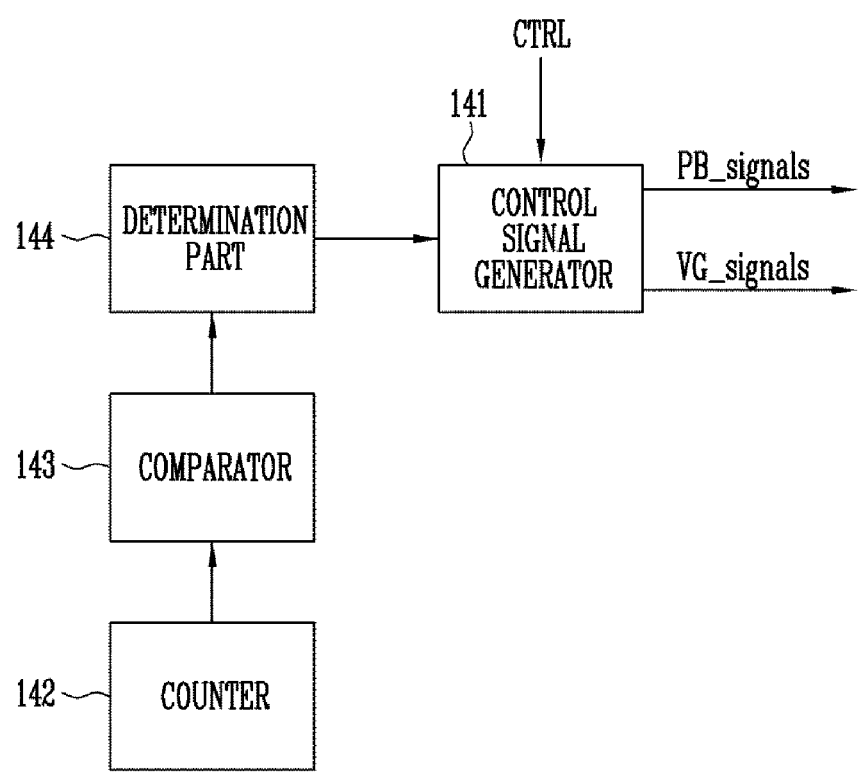
FIG. 2 is a block diagram illustrating a representation of an example of a control logic according to an embodiment.

FIG. 2 is a block diagram illustrating a representation of an example of a control logic according to an embodiment.

Referring to FIG. 2, the control logic 140 (i.e., see FIG. 1) may include a control signal generator 141, a counter 142, and a comparator 143. The control logic 140 may include a determination part 144.

The control signal generator 141 generates and outputs the page buffer control signals PB_signals and the voltage generator control signals VG_signals used for a program pulse applying operation. The control signal generator 141 may generate and output the page buffer control signals PB_signals and the voltage generator control signals VG_signals used for a program pulse applying operation in response to the control signal CTRL.

The counter 142 may count and output the number of the repeated program pulse applying operations or the repeated verification operations. For example, the number of the applied program pulses or the number of the applied verification voltage is counted and a count signal is output.

The comparator 143 may compare the count signal output from the counter 142 and a set bit corresponding to a set number of times, and determine whether the number of the applied program pulses or the number of the applied verification voltage is less than or equal to, or greater than the set number of times to output a comparison signal.

The determination part 144 may select the single sensing operation or the multi sensing operation based on the comparison signal output from the comparator 143. For example, when the number of the applied program pulses or the number of the applied verification voltage is less than or equal to the set number of times, the above is determined as an initial stage of the program operation and the control signal generator 141 is controlled to perform the multi sensing operation. When the number of the applied program pulses or the number of the applied verification voltage is greater than the set number of times, the above is determined as a stage after the initial stage and the control signal generator 141 is controlled to perform the single sensing operation.

Figure 3:
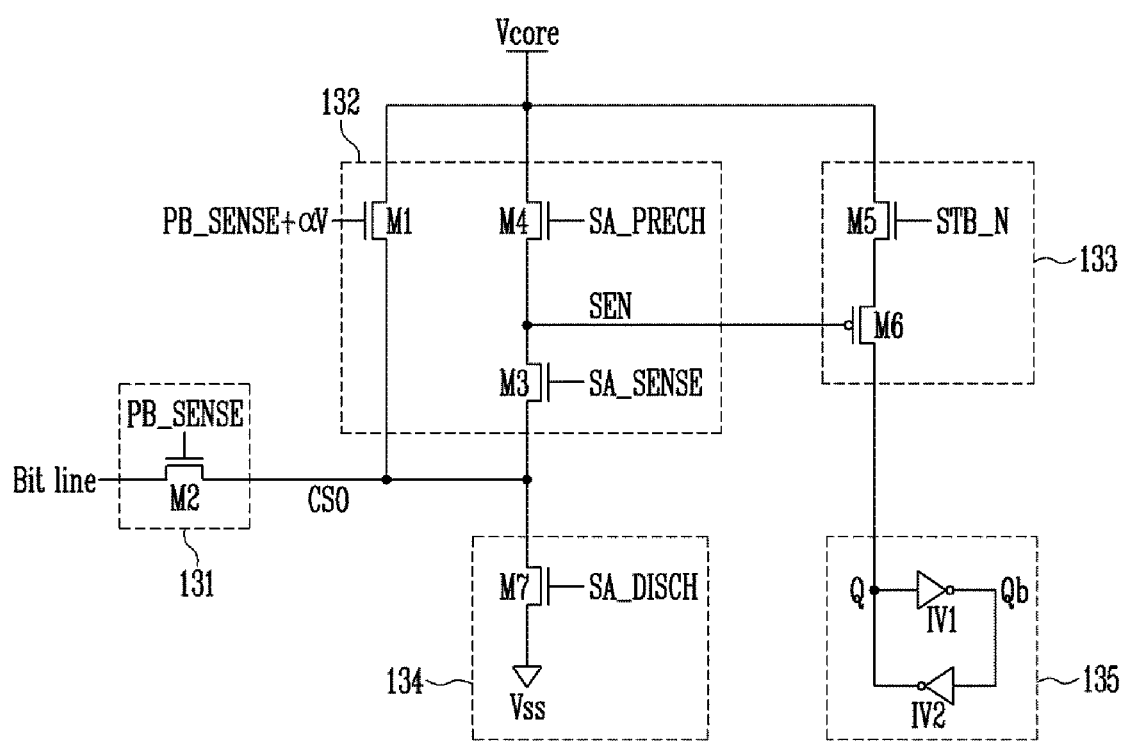
FIG. 3 is a circuit diagram illustrating a representation of an example of a page buffer according to an embodiment.

FIG. 3 is a circuit diagram illustrating a representation of an example of a page buffer according to an embodiment.

Referring to FIG. 3, a page buffer PB1 may include a bit line sensing circuit 131, a clamp circuit 132, and a current determination circuit 133. The page buffer PB1 may include an internal node discharge circuit 134, and a latch circuit 135.

The bit line sensing circuit 131 may be connected between a bit line Bit line and an internal node CSO. The bit line sensing circuit 131 may electrically connect the bit line and the internal node CSO in response to the page buffer sensing signal PB_SENSE. The bit line sensing circuit 131 may control a potential of the internal node CSO based on a potential of the bit line Bit line.

The clamp circuit 132 may be connected between the power voltage terminal Vcore and the internal node CSO. The clamp circuit 132 may supply current to the internal node CSO. The clamp circuit 132 may supply the current to the internal node CSO in response to a set voltage PB_SENSE+αV, a precharge signal SA_PRECH, and a sensing signal SA_SENSE. The set voltage PB_SENSE+αV may be greater than the page buffer sensing signal PB_SENSE applied to the bit line sensing circuit 131 by a predetermined potential αV.

The clamp circuit 132 may include a plurality of transistors M1, M3, and M4. The transistor M1 is connected between the power voltage terminal Vcore and the internal node CSO. The transistor M1 may be turned on or off in response to the set voltage PB_SENSE+αV. The transistors M4 and M3 may be connected in series between the power voltage terminal Vcore and the internal node CSO. The transistor M4 may be turned on or off in response to the precharge signal SA_PRECH. The transistor M3 may be turned on or off in response to the sensing signal SA_SENSE.

The current determination circuit 133 is connected between the power voltage terminal Vcore and the latch circuit 135. The current determination circuit 133 may supply an amount of current corresponding to a potential of a sensing node SEN interposed between the third and fourth transistors M3 and M4 of the clamp circuit 132 to the latch circuit 135 in response to a strobe signal STB_N.

The current determination circuit 133 may include a transistor M5 and a transistor M6 connected in series between the power voltage terminal Vcore and the latch circuit 135. The transistor M5 is turned on or off in response to the strobe signal STB_N. The transistor M6 adjusts an amount of current supplied from the power voltage terminal Vcore based on a potential of the sensing node SEN, and supplies the adjusted amount of current to the latch circuit 135.

The internal node discharge circuit 134 is connected between the internal node CSO and a ground source Vss. The internal node discharge circuit 134 may discharge the internal node CSO to a low level in response to a discharge signal SA_DISCH. The internal node discharge circuit 134 is configured to include a transistor M7 connected between the internal node CSO and the ground source Vss. The transistor M7 may be turned on or off in response to the discharge signal SA_DISCH.

The latch circuit 135 is connected to the current determination circuit 133, and may store data based on an amount of current supplied from the current determination circuit 133. The latch circuit 135 may include an inverter IV1 and an inverter IV2 connected in reverse-parallel between a first node Q and a second node Qb.

Figure 4:
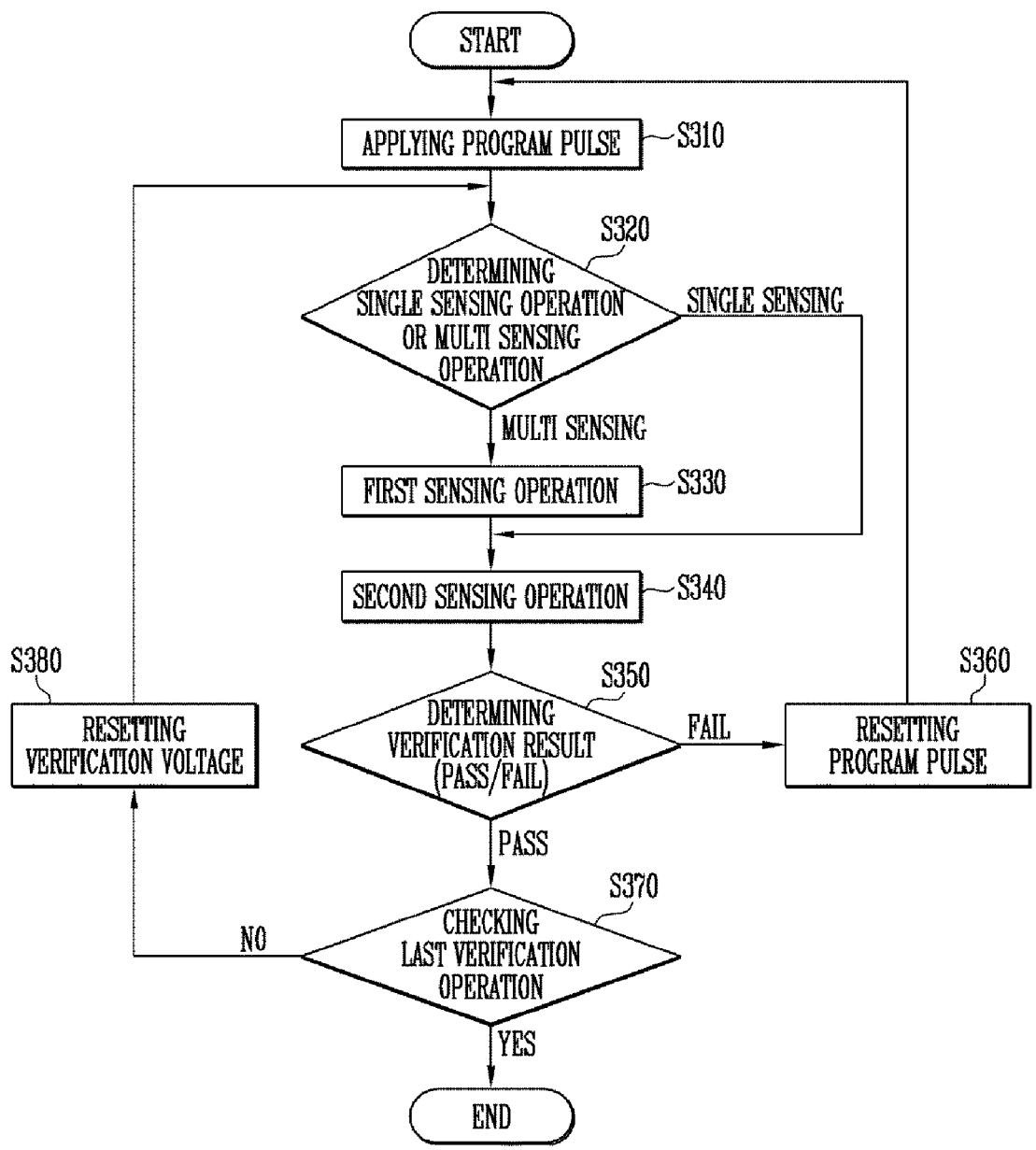
FIG. 4 is a flow chart illustrating a representation of an example of a method of operating a semiconductor memory device according to an embodiment.

FIG. 4 is a flow chart illustrating a representation of an example of a method of operating a semiconductor memory device according to an embodiment.

Figure 5:
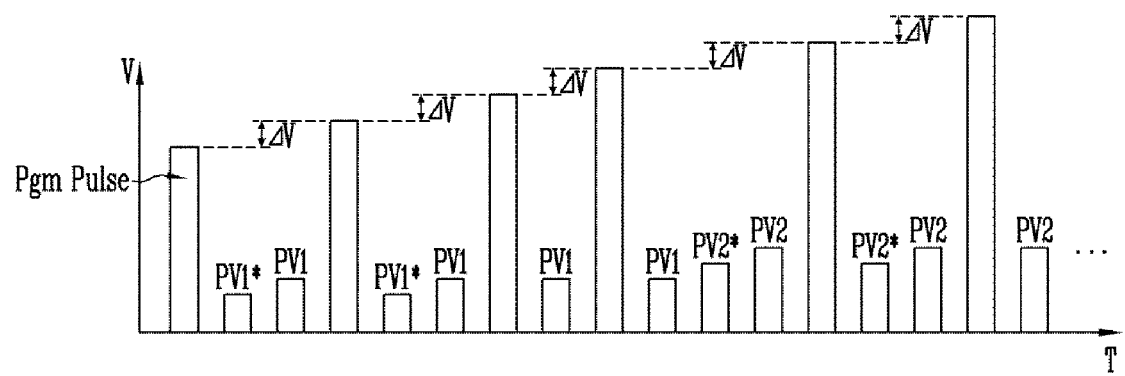
FIG. 5 is a waveform diagram representation illustrating a program pulse and a verification voltage for explaining the method of operating the semiconductor memory device according to an embodiment.

FIG. 5 is a waveform diagram representation illustrating a program pulse and a verification voltage for explaining the method of operating the semiconductor memory device according to an embodiment.

The method of operating the semiconductor memory device according to an embodiment will be described with reference to FIGS. 1 to 5 below.

1) Applying Program Pulse (S310)

When a program voltage applying operation is performed during a program operation, the address decoder 120 selects one memory block among a plurality of memory blocks BLK1 to BLKz in response to an address ADDR, and applies a program pulse PGM Pulse to a selected word line of the selected memory block.

2) Determining Single Sensing Operation or Multi Sensing Operation (S320)

After the operation of applying the program pulse (S310) is completed, a control logic determines whether a single sensing operation is performed or a multi sensing operation is performed during a verification operation. For example, the control logic determines as the multi sensing operation when the program pulse is applied less than a set number of times or the verification operation corresponding to one program state is performed less than the set number of times, and determines as the single sensing operation when the program pulse is applied equal to or more than the set number of times or the verification operation corresponding to the one program state is performed equal to or more than the set number of times.

3) First Sensing Operation (S330)

When the operation of determining the single sensing operation or the multi sensing operation (S320) is determined as the multi sensing operation, the first sensing operation is performed.

In the first sensing operation, a pre-verification voltage (for example, PV1*) which is less than a target verification voltage (for example, PV1) is applied to the selected word line. Then a program state of a memory cell is sensed using a page buffer.

The sensing operation of the page buffer will be described below.

The sensing signal SA_SENSE and the precharge signal SA_PRECH are applied at high levels the transistor M4 and the transistor M5 are turned on. The internal node CSO and the sensing node SEN are precharged to a level of a power voltage Vcore. The page buffer sensing signal PB_SENSE is applied at a high level, and the bit line Bit line is electrically connected to the internal node CSO.

After a predetermined time elapses, the precharge signal SA_PRECH is transitioned from a high level to a low level, and the power voltage Vcore applied to the internal node CSO cuts off. When a threshold voltage of a target memory cell is lower than a pre-verification voltage, the target memory cell is turned on and a potential of the internal node CSO is discharged to a low level by a discharge current path through the bit line Bit line.

Thus, the internal node CSO and the sensing node SEN are discharged to low levels, and a transistor M6 is turned on by the sensing node SEN of the low level.

Then, when the strobe signal STB_N is applied at a low level for a predetermined time and the transistor M5 is turned on, the power voltage Vcore is applied to the first node Q of the latch circuit 135, and thus, the first node Q has a high level. Thus, data corresponding to an erased cell is latched in the latch circuit 135.

However, when the threshold voltage of the target memory cell is greater than the pre-verification voltage, the target memory cell is turned off, and potential of the internal node CSO maintains the precharge level.

Thus, the internal node CSO and the sensing node SEN maintain the precharge levels. Then the strobe signal STB_N is applied at the low level for a predetermined time. Thus, the transistor M6 is turned off by the sensing node SEN having the precharge level although the transistor M5 is turned on. The first node Q of the latch circuit 135 maintains the low level of the initial stage, and data corresponding to a program cell is latched in the latch circuit 135.

The first verification operation is performed using the first sensing operation of the above-mentioned page buffer. The first verification operation may be defined as a pre-verification operation configured to determine erase cells in which threshold voltages have voltages lower than 0 V.

4) Second Sensing Operation (S340)

When the first sensing operation (S330) is completed or the operation of determining the single sensing operation or the multi sensing operation (S320) is determined as the single sensing operation, the second sensing operation is performed.

In the second sensing operation, after the target verification voltage (for example, PV1) greater than the pre-verification voltage (for example, PV1*) is applied to the selected word line, the program state of the memory cell is sensed using the page buffer.

When the number of the applied program pulses or the applied number of the verification operations is less than a set number of times, the sensed program state is determined as an initial stage of the program operation. In the initial stage of the program operation, since the number of the memory cells, in which threshold voltages of the memory cells are programmed to be greater than or equal to a target threshold voltage, is relatively small, the sensed program state is determined as an erase cell during the sensing operation, and thus, current paths are greatly generated through a common source line, thereby generating errors in the sensing operation. In order to increase accuracy of the sensing operation, some of the erase cells are determined through the first sensing operation, and the second sensing operation is performed on the remaining erase cells.

However, when the number of the applied program pulses or the number of the applied verification operations is performed greater than the set number of times, the number of the memory cells, in which threshold voltages of the memory cells are programmed to be greater than or equal to target threshold voltages, is relatively increased. Thus, the number of the current paths through the common source line is decreased and accuracy of the sensing operation is increased. As mentioned above, since the first sensing operation is skipped and the second sensing operation is performed, a time for the verification operation may be reduced.

5) Determining Verification Result (PASS/FAIL) (S350)

As a result of the second sensing operation (S340), a program verification operation is performed using the sensed data and pass or fail of the program operation is determined.

6) Resetting Program Pulse (S360)

As a result of the determination of the verification result (S350), when the program operation is determined as fail, after a new program pulse in which a program pulse (Pgm Pulse) is increased by a step voltage $\Delta V$ is set, the operation (S310) of applying the program pulse is performed again.

7) Checking Last Verification Operation (S370)

As a result of determination of the verification result (S350), when the program operation is determined as pass, a current program verification operation is checked as a verification operation corresponding to a last program state. The last program state may be a verification operation corresponding to a highest program state among program states of a multi level cell or a triple level cell.

8) Resetting Verification Voltage (S380)

As a result of checking the last verification operation (S370) with respect to the current verification operation, when the current verification operation is determined not to be the last verification operation, the verification voltage is reset. For example, when the current verification operation is the first program state (corresponding to PV1), after the verification voltage is set to be PV2, the determining of the single sensing operation or the multi sensing operation (S320) is performed again.

Figure 6:
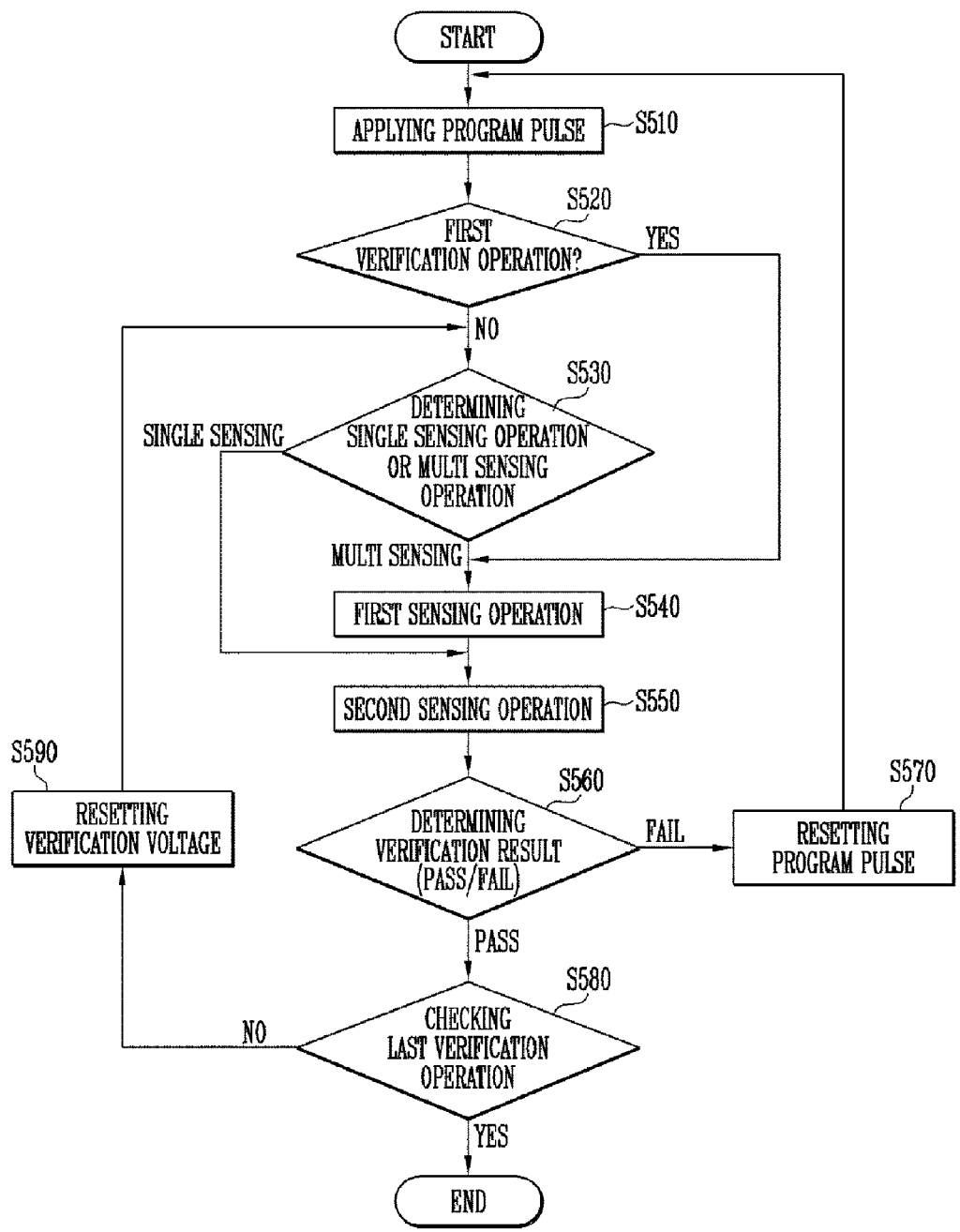
FIG. 6 is a flow chart illustrating a representation of an example of a method of operating a semiconductor memory device according to an embodiment.

FIG. 6 is a flow chart illustrating a representation of an example of a method of operating a semiconductor memory device according to an embodiment.

With reference to FIGS. 1 to 3, 5, and 6, the method of operating the semiconductor memory device according to an embodiment will be described below.

1) Applying Program Pulse (S510)

In a program voltage applying operation during a program operation, the address decoder 120 may select one memory block among a plurality of memory blocks BLK1 to BLKz in response to an address ADDR, and applies a program pulse PGM Pulse to a selected word line of the selected memory block.

2) First Verification Operation (S520)

A verification operation to be currently processed is determined whether the first verification operation or not. The first verification operation may be a verification operation configured to determine whether memory cells have threshold voltages greater than a first program state (corresponding to PV1) or smaller than the first program state (corresponding to PV1).

Since the first verification operation is a verification operation performed at an initial stage, a following operation of determining a single sensing operation or a multi sensing operation (S530) is skipped, and the multi sensing operation may be directly performed. Thus, an operation time may be improved.

3) Determining Single Sensing Operation or a Multi Sensing Operation (S530)

When the verification operation to be currently processed in the determining of the first verification operation (S520) is determined as not the operation of determining the first verification operation, a control logic determines whether the single sensing operation is performed or the multi sensing operation is performed during a verification operation. For example, the control logic determines as the multi sensing operation when the number of applied program pulses is smaller than a set number of times or the number of the performed verification operations corresponding to one program state is less than the set number of times, and determines as the single sensing operation when the number of applied program pulses is equal to or more than a present number of times or the number of the performed verification operations corresponding to one program state is equal to or more than the set number of times.

4) First Sensing Operation (S540)

When the verification operation to be currently processed in the determining of the first verification operation (S520) is determined as the first verification operation or when the determining of the single sensing operation or the multi sensing operation (S530) is determined as the multi sensing operation, the first sensing operation is performed.

In the first sensing operation, after the pre-verification voltage (for example, PV2*) less than the target verification voltage (for example, PV2) is applied to the selected word line, the program state of the memory cell is sensed using the page buffer.

The sensing operation of the page buffer is the same as described in an embodiment discussed above with relation to FIG. 4.

5) Second Sensing Operation (S550)

When the first sensing operation (S540) is completed or the determination result is determined as the single sensing operation in the determining of the single sensing operation or the multi sensing operation (S530), the second sensing operation is performed.

In the second sensing operation, after the target verification voltage (for example, PV2) greater than the pre-verification voltage (for example, PV2*) is applied to the selected word line, the program state of the memory cell is sensed using the page buffer.

When the number of the applied program pulses or the number of the performed verification operations is smaller than a set number of times, the sensed program state is determined as an initial stage of the program operation. In the initial stage of the program operation, since the number of the memory cells, in which threshold voltages of the memory cells are programmed to be greater than or equal to target threshold voltages, is relatively small, the sensed program state is determined as an erase cell during the sensing operation, and thus, current paths are greatly generated through a common source line, thereby generating errors in the sensing operation. In order to increase accuracy of the sensing operation, some of the erase cells are determined through the first sensing operation, and the second sensing operation is performed on the remaining erase cells.

However, when the number of the applied program pulses or the number of the performed verification operations is greater than the set number of times, the number of the memory cells, in which threshold voltages of the memory cells are programmed to be greater than or equal to target threshold voltages, is relatively increased. Thus, the number of the current paths through the common source line may be decreased, and accuracy of the sensing operation may be increased. Since the first sensing operation may be skipped and the second sensing operation may be performed, a time for the verification operation may be decreased.

6) Determining Verification Result (PASS/FAIL) (S560)

As a result of the second sensing operation (S550), a program verification operation is performed using the sensed data, and the program operation is determined as pass or fail.

7) Resetting Program Pulse (S570)

As a result of the determining of the verification result (S560), when the program operation is determined as fail, after a new program pulse in which a program pulse is increased by a step voltage $\Delta V$ is set, the operation (S520) of applying the program pulse is performed again.

8) Checking Last Verification Operation (S580)

As a result of determining the verification result (S560), when the program operation is determined as pass, a current program verification operation is checked as a verification operation corresponding to a last program state. The last program state may be a verification operation corresponding to a highest program state among program states of a multi level cell or a triple level cell.

9) Resetting Verification Voltage (S590)

As a result of checking the last verification operation (S580) for the current verification operation, when the current verification operation is determined not to be the last verification operation, the verification voltage is reset. For example, when the current verification operation is the first program state (corresponding to PV1), after the verification voltage is set to PV2, the determining of the single sensing operation or the multi sensing operation (S530) is performed again.

Figure 7:
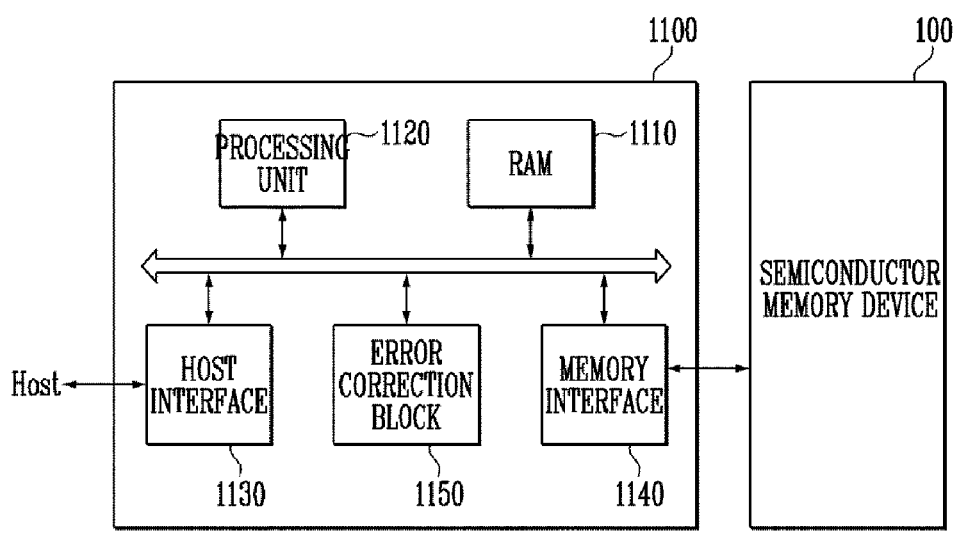
FIG. 7 is a block diagram illustrating a representation of an example of a memory system including the semiconductor memory device illustrated in FIG. 1.

FIG. 7 is a block diagram illustrating a representation of an example of a memory system including the semiconductor memory device illustrated in FIG. 1.

Referring to FIG. 7, the memory system 1000 may include the semiconductor memory device 100 and a controller 1100.

The semiconductor memory device 100 may be configured to include the semiconductor device described in FIG. 1, and may be operated. Hereinafter, any repetitive explanations will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to execute a firmware configured to control the semiconductor memory device 100.

The controller 1100 may include a random access memory (RAM) 1110, a processing unit 1120, a host interface 1130, a memory interface 1140, and an error correction block 1150. The RAM 1110 may be configured to use at least one of an operation memory of the processing unit 1120, a cache memory interposed between the semiconductor memory device 100 and the host Host, and a buffer memory interposed between the semiconductor memory device 100 and the host Host. The processing unit 1120 controls overall operations of the controller 1100. The controller 1100 may temporarily store program data provided from the host Host during the write operation.

The host interface 1130 may include a protocol configured to perform data exchange between the host Host and the controller 1100. In an example of an embodiment, the controller 1100 is configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The memory interface 1140 interfaces with the semiconductor memory device 100. For example, the memory interface 1140 may include a NAND interface or a NOR interface.

The error correction block 1150 is configured to detect and correct an error in data received from the semiconductor memory device 100 using an error correction code (ECC). The processing unit 1120 may adjust a read voltage based on the error detection result of the error correction block 1150, and adjust the semiconductor memory device 100 to perform a read operation again. In an example of an embodiment, the error correction block 1150 may be provided as a component of the controller 1100.

The controller 1100 and the semiconductor memory device 100 may be integrated into one semiconductor device. In an example of an embodiment, the controller 1100 and the semiconductor memory device 100 may be integrated into one semiconductor device, and thus configure a memory card. For example, the controller 1100 and the semiconductor memory device 100 are integrated into one semiconductor device, and thus configure a memory card such as a PC card, a personal computer memory card international association (PCMCIA) card, a compact flash (CF) card, a smart media card (SM, SMC), a memory stick, a multimedia card (MMC, RS-MMC, MMCmicro), an SD card (SD, miniSD, microSD, SDHC), a universal flash storage device (UFS), etc.

The controller 1100 and the semiconductor memory device 100 may be integrated into one semiconductor device, and thus, configure a solid state drive (SSD). The SSD includes a storage device configured to store data in a semiconductor memory. When the memory system 1000 is used as the SSD, an operation speed of the host Host connected to the memory system 1000 may be greatly increased.

In an embodiment, the memory system 1000 may be provided to one of a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio decoder, a digital audio player, a digital picture decoder, a digital picture player, a digital video decoder, a digital video player, a device to receive or transmit information in a wireless environment, one of various electronic devices included in a home network, one of various electronic devices included in a computer network, one of various electronic devices included in a telematics network, an RFID device, one of various components included in a computing system, and/or the like.

In an example of an embodiment, the semiconductor memory device 100 or the memory system 1000 may be mounted as a package having various shapes. For example, the semiconductor memory device 100 or the memory system 1000 may be mounted by a package type such as a package on package (PoP), ball grid arrays (BGAs), chip scale packages (CSPs), a plastic leaded chip carrier (PLCC), a plastic dual in line package (PDIP), a die in wafer pack, a die in wafer form, a chip on board (COB), a ceramic dual in line package (CERDIP), a plastic metric quad flatpack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), and/or the like.

Figure 8:
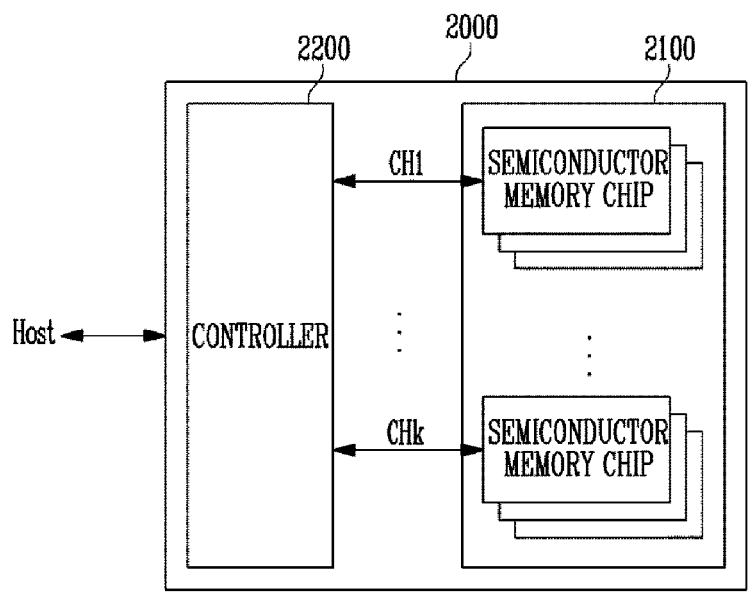
FIG. 8 is a block diagram illustrating a representation of an example of an application embodiment of the memory system illustrated in FIG. 7.

FIG. 8 is a block diagram illustrating a representation of an example of an application embodiment of the memory system illustrated in FIG. 7.

Referring to FIG. 8, the memory system 2000 may include a semiconductor memory device 2100 and a controller 2200. The semiconductor memory device 2100 may include a plurality of semiconductor memory chips. The plurality of semiconductor memory chips are classified into a plurality of groups.

In FIG. 8, the plurality of groups are described to communicate with the controller 2200 through first to $k^{th}$ channels CH1 to CHk, respectively. Each semiconductor memory chip may have the substantially the same structure and operation as the semiconductor memory device 100 illustrated in FIG. 1.

Each group is configured to communicate with the controller 2200 through one common channel. The controller 2200 is configured to be the same as the controller 1100 illustrated in FIG. 7, and to control the plurality of memory chips of the semiconductor memory device 2100 through the plurality of channels CH1 to CHk.

Figure 9:
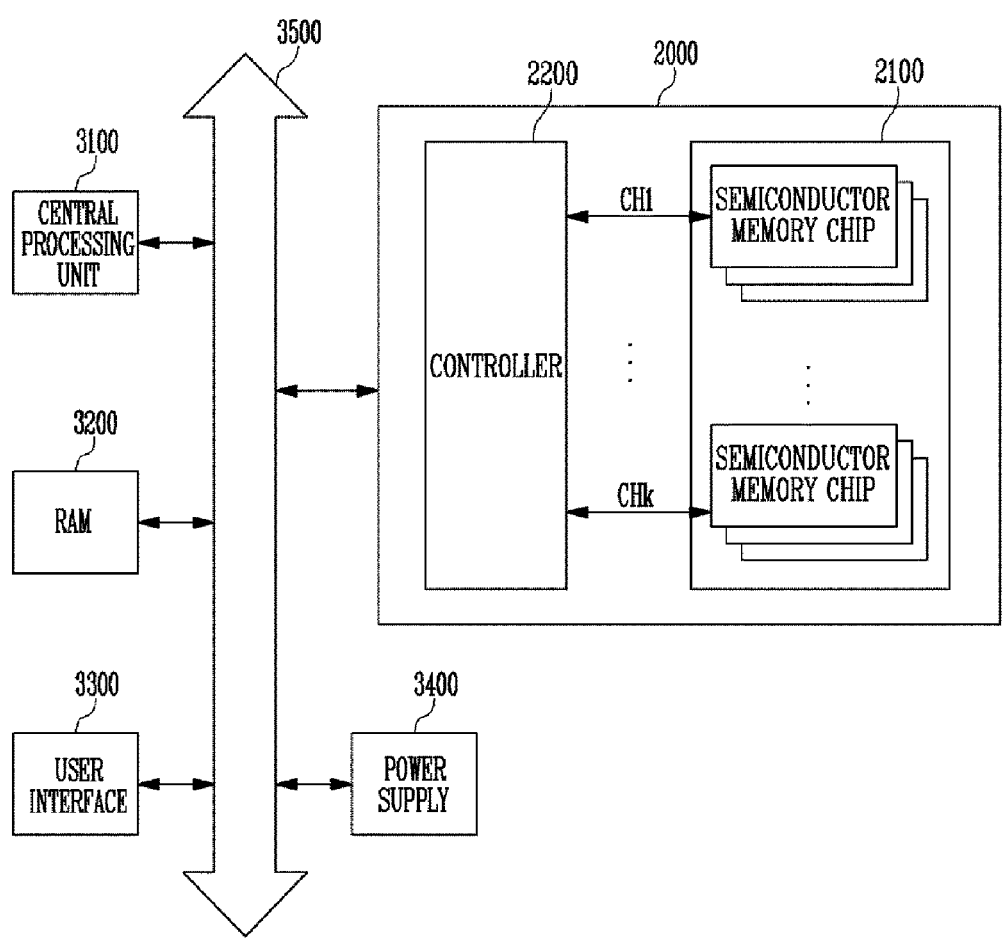
FIG. 9 is a block diagram illustrating a representation of an example of a computing system including the memory system illustrated with reference to FIG. 8.

FIG. 9 is a block diagram illustrating a representation of an example of a computing system including the memory system illustrated with reference to FIG. 8.

Referring to FIG. 9, the computing system 3000 may include a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided from the user interface 3300 or processed by the central processing unit 3100 is stored in the memory system 2000.

In FIG. 9, the semiconductor memory device 2100 is illustrated as being connected to the system bus 3500 through the controller 2200. However, the semiconductor memory device 2100 may be configured to be directly connected to the system bus 3500. In this example, the operation of the controller 2200 may be performed by the central processing unit 3100 and the RAM 3200.

In FIG. 9, the memory system 2000 illustrated in FIG. 8 is provided. However, the memory system 2000 may be substituted by the memory system 1000 illustrated in FIG. 7. In an embodiment, the computing system 3000 may include both of the memory systems 1000 and 2000 illustrated in FIGS. 7 and 8.

Accordingly, a program verification time may be reduced because a single sensing operation or a multi sensing operation is selectively performed based on the number of applied program pulses or the number of applied verification voltages.

It will be apparent to those skilled in the art that various modifications can be made to the above-described examples of embodiments without departing from the spirit or scope of the application.

What is claimed is:

1. A semiconductor memory device, comprising:
a memory cell array including a plurality of memory cells;
a peripheral circuit configured to perform a program pulse applying operation and a verification operation on the memory cell array; and
a control logic configured to control the peripheral circuit to selectively perform a single sensing operation or a multi sensing operation during the verification operation,
wherein the control logic further configured to:
determine whether the verification operation is a last verification operation if a result of the verification operation is determined as pass,
reset a target verification voltage if the verification operation is determined as not the last verification operation, and
performing subsequent verification operation, based on the reset target verification voltage,
wherein the control logic includes:
a control signal generator configured to output control signals to control the peripheral circuit during the program pulse applying operation and the verification operation;
a counter configured to output a count signal by counting the number of the program pulse applying operations or the verification operations;
a comparator configured to compare the count signal with a set bit corresponding to a set number of times, and output a comparison signal whether the number of applied program pulses according to the program pulse applying operation or the number of applied verification voltages according to the verification operation is less than or equal to, or greater than the set number of times; and
a determination part configured to determine a type of sensing operation during the verification operation based on the comparison signal,
wherein the type of sensing operation includes the multi sensing operation and the single sensing operation, and the determination part configured to control the control signal generator.

2. The semiconductor memory device of claim 1, wherein the peripheral circuit comprises:
a voltage generator configured to generate a program pulse during the program pulse applying operation, and generate at least one of a pre-verification voltage and the target verification voltage;
an address decoder configured to apply the program pulse to a memory cell selected among the memory cell array based on an address signal, and apply the pre-verification voltage and the target verification voltage to the selected memory cell based on the address; and
a read/write circuit configured to perform the single sensing operation or the multi sensing operation and verify a program state of the selected memory cell.

3. The semiconductor memory device of claim 2, wherein the single sensing operation verifies the program state of the selected memory cell using the read/write circuit after the target verification voltage is applied to the selected memory cell.

4. The semiconductor memory device of claim 2, wherein the multi sensing operation includes:
a first verification operation including applying the pre-verification voltage to the selected memory cell and performing, by the read/write circuit, a verification operation on a program state of the selected memory cell, and
a second verification operation including applying the target verification voltage to the selected memory cell and performing, by the read/write circuit, a verification operation on a program state of the selected memory cell.

5. The semiconductor memory device of claim 2, wherein the pre-verification voltage is less than the target verification voltage.

6. The semiconductor memory device of claim 1, wherein the control logic is configured to control the peripheral circuit to perform the single sensing operation to perform the verification operation if the verification operation is a program verification operation, the program verification operation distinguishing an erase cell and a program cell.

7. The semiconductor memory device of claim 2, wherein the control logic controls the peripheral circuit to increase a program pulse by a step voltage and reset the program pulse if a result of the verification operation is determined as fail and perform the program pulse applying operation, and performs the verification operation again by newly setting the pre-verification voltage and the target verification voltage to perform a verification operation on another program state if a result of the verification operation is determined as pass.

8. A method of operating a semiconductor memory device, comprising:
applying a program pulse to at least one memory cell selected among a plurality of memory cells;
determining a type of sensing operation of a subsequent verification operation, wherein the type of sensing operation includes a single sensing operation and a multi sensing operation, based on the number of applied program pulses according to an operation for the applying the program pulse or the number of performed verification operations according to a verification operation; and
performing the subsequent verification operation according to the multi sensing operation when the multi sensing operation is determined, wherein the multi sensing operation includes sequentially performing a first sensing operation and a second sensing operation, performing the subsequent verification operation according to the single sensing operation when the single sensing operation is determined, wherein the single sensing operation includes the second sensing operation, determining whether a current verification operation is a last verification operation when a result of the subsequent verification operation is determined as pass, resetting a pre-verification voltage and a target verification voltage when a result of the current verification operation is not determined as the last verification operation, and re-performing the subsequent verification operation, based on at least one of the reset pre-verification voltage and the reset target verification voltage, from an operation for the determining the type of sensing operation.

9. The method of operating the semiconductor memory device of claim 8, wherein the determining of the type of the sensing operation includes:

determining the multi sensing operation when the number of applied program pulses or the number of performed verification operations is smaller than a set number of times, and determining the single sensing operation when the number of applied program pulses or the number of performed verification operations is greater than or equal to the set number of times.

10. The method of operating the semiconductor memory device of claim 8, wherein the first sensing operation includes at least one of operations of:

applying the pre-verification voltage which is less than a target verification voltage to the at least one selected memory cell, and sensing a current of a bit line connected to the at least one selected memory cell.

11. The method of operating the semiconductor memory device of claim 10, wherein the second sensing operation includes at least one of operations of:

applying the target verification voltage to the at least one selected memory cell, and sensing a current of the bit line connected to the at least one selected memory cell.

12. The method of operating the semiconductor memory device of claim 8, further comprising:

increasing the program pulse by a step voltage and resetting the program pulse when the result of the subsequent verification operation is determined as fail, and re-performing, based on the reset program pulse, from an operation for the applying the program pulse.

13. A method of operating a semiconductor memory device, comprising:

applying a program pulse to at least one memory cell selected from a plurality of memory cells;

performing a multi-sensing sensing operation when a subsequent verification operation is a first verification operation using a first verification voltage;

determining a type of sensing operation of the subsequent verification operation as a single sensing operation or the multi-sensing operation on the basis of a number of applied program pulses or a number of performed verification operations when the subsequent verification operation is not the first verification operation; and performing the single sensing operation or the multi-sensing operation according to a result of determination, wherein the multi sensing operation includes sequentially performing a first sensing operation and a second sensing operation, the first sensing operation includes applying a pre-verification voltage lower than a target verification voltage to a word line of the at least one memory cell and sensing a program state, and the second sensing operation includes applying the target verification voltage to the word line of the at least one memory cell and sensing the program state, and wherein the single sensing operation includes performing the second sensing operation.

14. The method of operating the semiconductor memory device of claim 13, wherein the determining of the type of sensing operation includes:

determining the multi sensing operation when the number of applied program pulses or the number of performed verification operations is less than a set number of times, and determining the single sensing operation when the number of applied program pulses or the number of performed verification operations is greater than or equal to the set number of times.

15. The method of operating the semiconductor memory device of claim 13, wherein the first sensing operation includes applying a pre-verification voltage less than a target verification voltage to the at least one selected memory cell and sensing a current of a bit line connected to the selected memory cell.

16. The method of operating the semiconductor memory device of claim 15, wherein the second sensing operation includes applying the target verification voltage to the selected memory cell and sensing a current of the bit line connected to the at least one selected memory cell.

17. The method of operating the semiconductor memory device of claim 13, further comprising:

increasing the program pulse by a step voltage and resetting the program pulse based on the increased program pulse when a result of the subsequent verification operation is determined as fail, and re-performing, based on the reset program pulse, from an operation for the applying the program pulse.

18. The method of operating the semiconductor memory device of claim 15, further comprising:

determining whether a current verification operation is a last verification operation when a result of the subsequent verification operation is determined as pass;

resetting the pre-verification voltage and the target verification voltage to perform a next verification operation when the current verification operation is not determined as the last verification operation, and re-performing the reset pre-verification voltage and the reset target verification voltage, from an operation for the determining the type of sensing operation.

* * * * *